(12) United States Patent
Cho et al.

(10) Patent No.: US 9,054,738 B2
(45) Date of Patent: Jun. 9, 2015

(54) QUANTIZER WITH SIGMA-DELTA MODULATOR, ANALOG-TO-DIGITAL CONVERTER INCLUDING THE SAME AND QUANTIZATION METHOD USING THE SAME

(71) Applicants: SNU R&DB Foundation, Seoul (KR); Neofidelity, Inc., Seoul (KR)

(72) Inventors: Junsoo Cho, Seoul (KR); Hyunjoong Lee, Gwanak-gu (KR); Suhwan Kim, Seoul (KR)

(73) Assignee: SNU R&DB FOUNDATION, Seoul (KR)

( * ) Notice: Subject to any disclaimer, the term of this patent is extended or adjusted under 35 U.S.C. 154(b) by 0 days.

(21) Appl. No.: 14/286,699

(22) Filed: May 23, 2014

(65) Prior Publication Data

US 2014/0347200 A1 Nov. 27, 2014

(30) Foreign Application Priority Data

May 24, 2013 (KR) .................. 10-2013-0059253

(51) Int. Cl.
*H03M 3/00* (2006.01)
*H03M 1/00* (2006.01)
(52) U.S. Cl.
CPC .............. *H03M 3/462* (2013.01); *H03M 1/002* (2013.01)

(58) Field of Classification Search
CPC ........ H03M 1/002; H03M 3/462; H03M 3/30
USPC ............................ 341/143, 144, 155, 61, 120
See application file for complete search history.

(56) References Cited

U.S. PATENT DOCUMENTS

| | | | | |
|---|---|---|---|---|
| 5,495,200 A * | 2/1996 | Kwan et al. | ................... | 327/553 |
| 5,748,126 A * | 5/1998 | Ma et al. | ....................... | 341/143 |
| 6,236,345 B1 * | 5/2001 | Dagnachew et al. | ......... | 341/143 |
| 8,532,503 B2 * | 9/2013 | Nakashima et al. | .......... | 398/208 |

FOREIGN PATENT DOCUMENTS

KR 10-0219021 B1 6/1999

OTHER PUBLICATIONS

Korean Office Action issued on Jun. 19, 2014 for the corresponding Korean Application No. 10-2013-0059253.

* cited by examiner

*Primary Examiner* — Brian Young
(74) *Attorney, Agent, or Firm* — Stein IP, LLC

(57) ABSTRACT

The present invention provides a quantizer with a sigma-delta modulator, an analog-to-digital converter including the same and a quantization method using the same capable of obtaining a high signal-to-noise ratio with a relatively small number of comparators. The quantizer, the analog-to-digital converter and the quantization method of the present invention reduces quantization errors and increases noise shaping order.

17 Claims, 15 Drawing Sheets

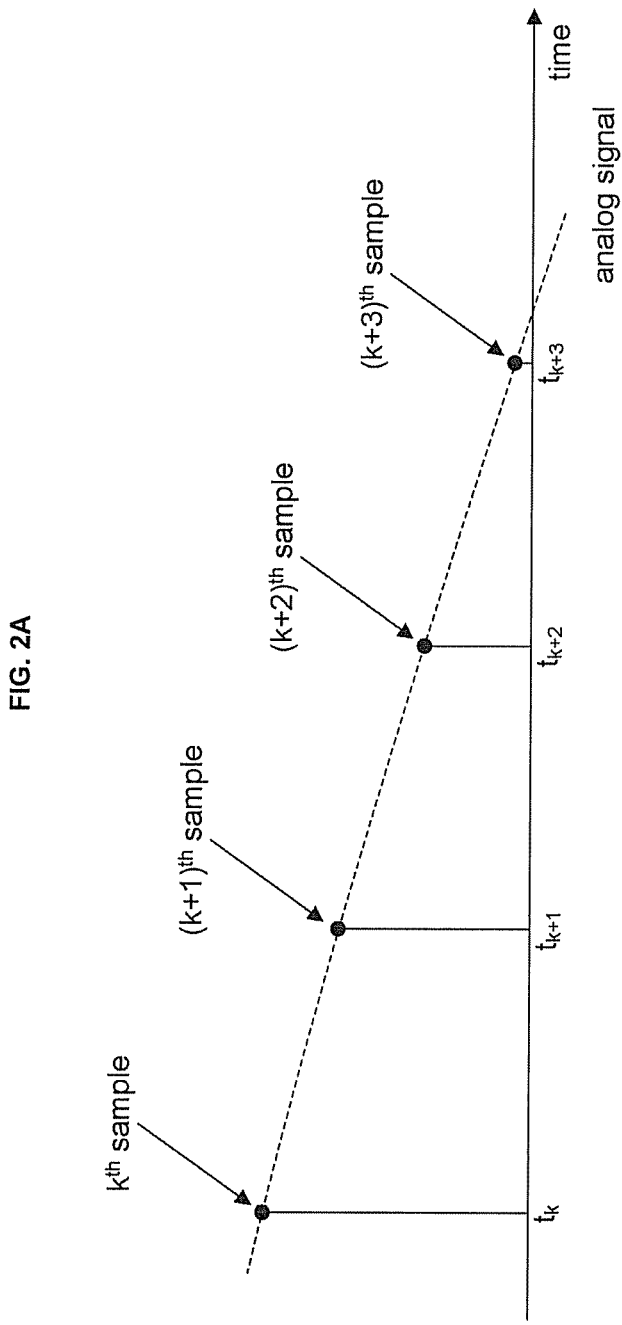

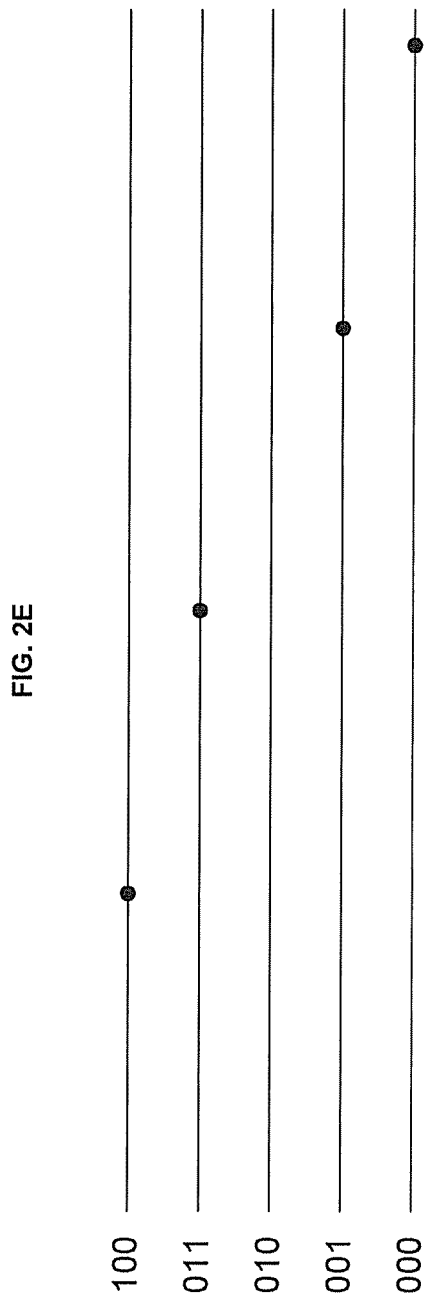

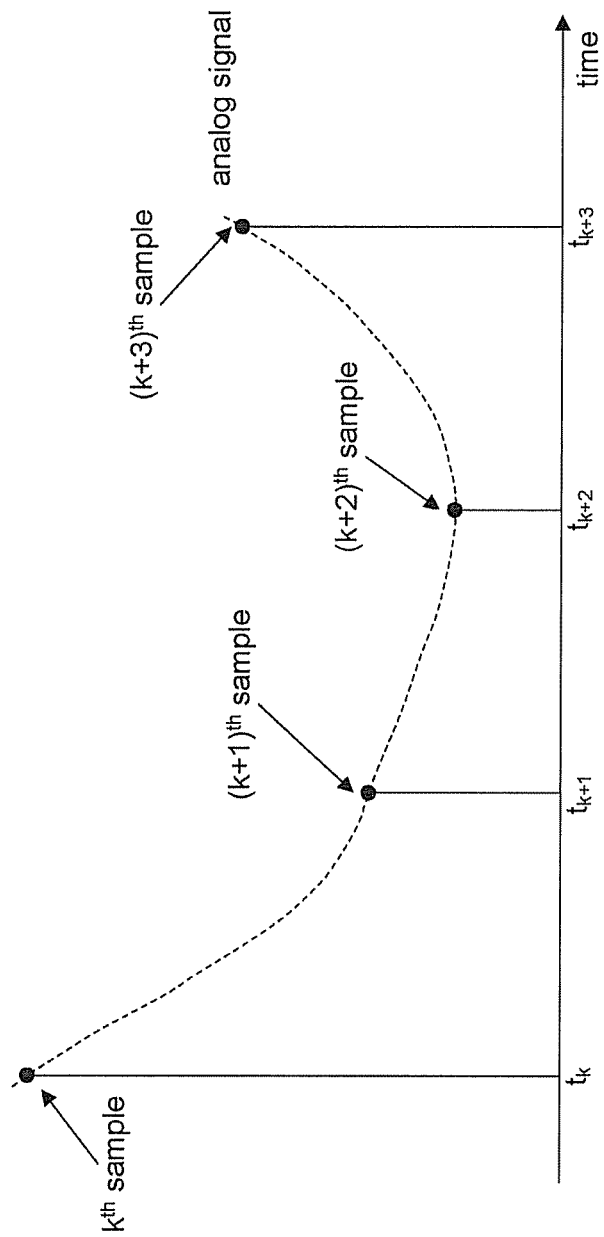

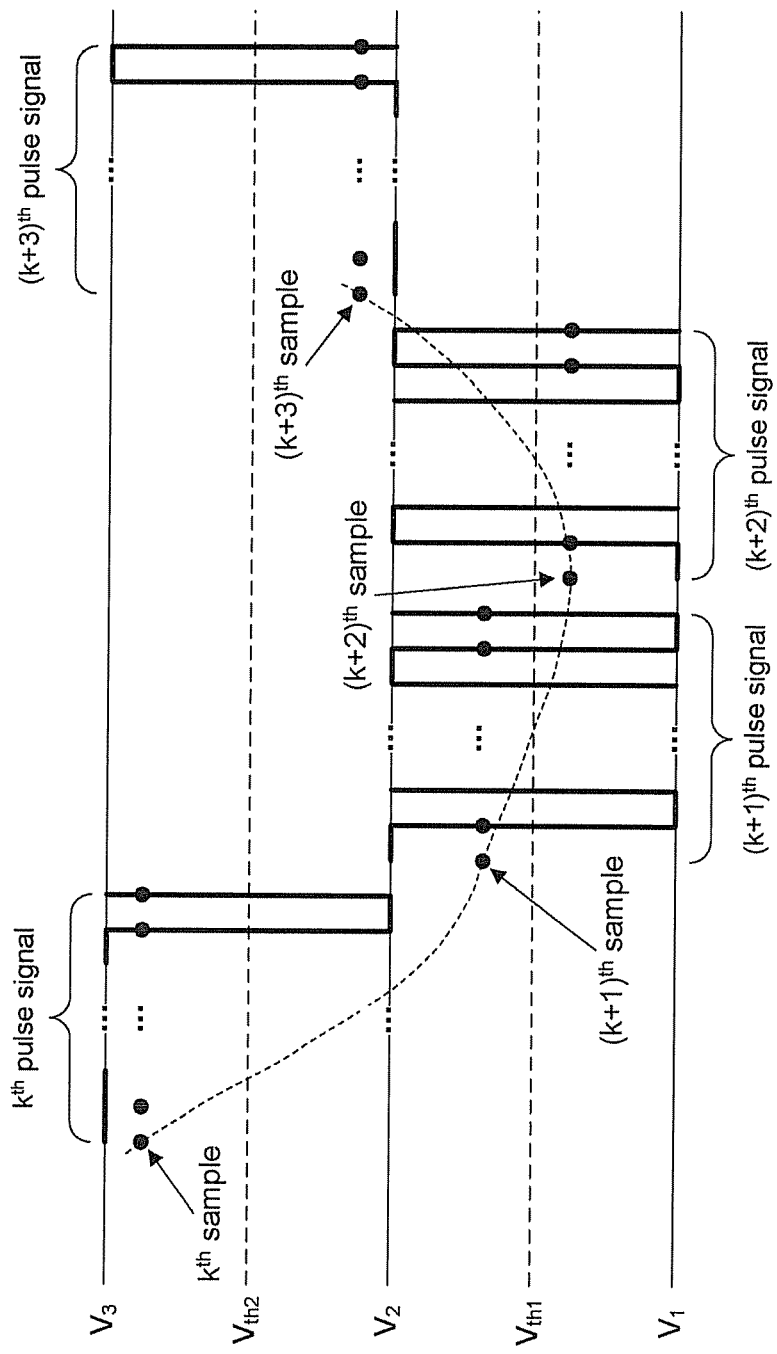

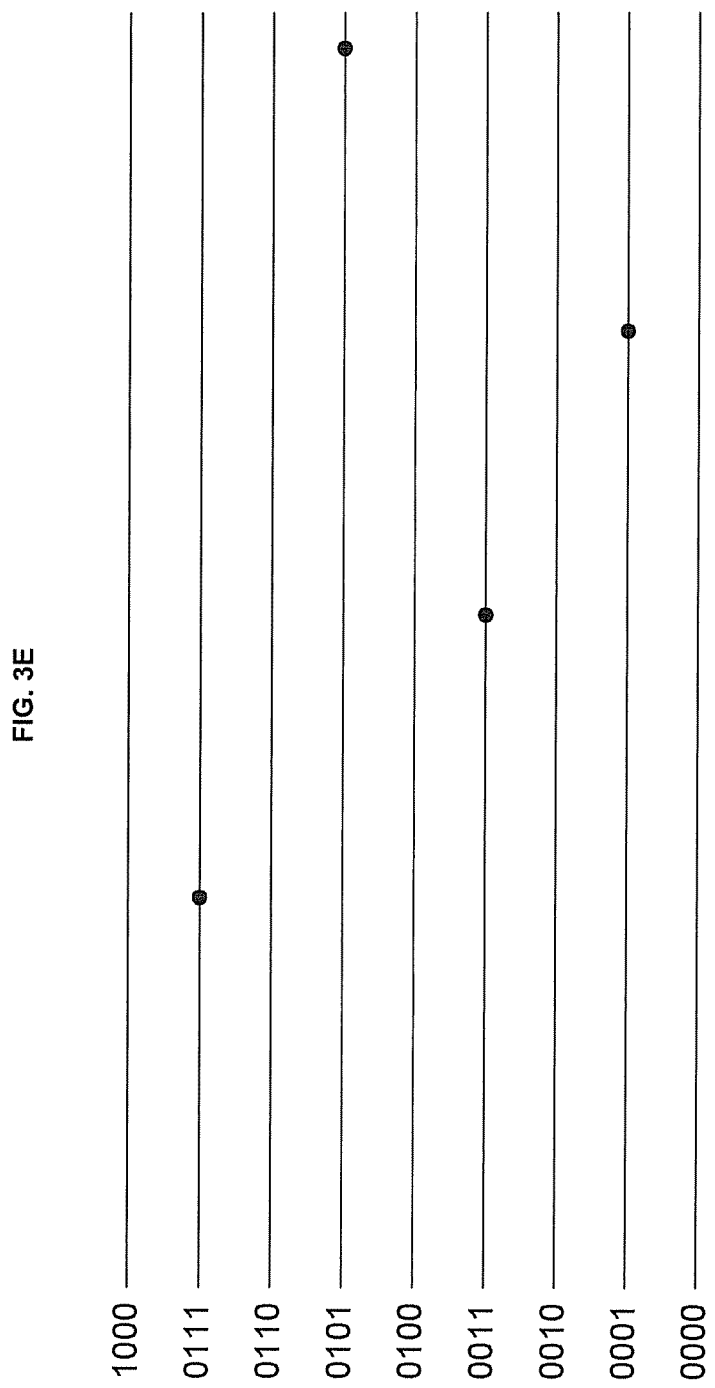

QUANTIZER WITH SIGMA-DELTA MODULATOR, ANALOG-TO-DIGITAL CONVERTER INCLUDING THE SAME AND QUANTIZATION METHOD USING THE SAME

CROSS-REFERENCE TO RELATED PATENT APPLICATION

This U.S. non-provisional patent application claims priority under 35 U.S.C. §119 of Korean Patent Application No. 10-2013-0059253, filed on May 24, 2013 in the Korean Intellectual Property Office, the entire contents of which are hereby incorporated by reference.

BACKGROUND OF THE INVENTION

1. Field of the Invention

The present invention relates to a quantizer with a sigma-delta modulator, an analog-to-digital converter including the same and a quantization method using the same, and more particularly, to a quantizer with a sigma-delta modulator, an analog-to-digital converter including the same and a quantization method using the same capable of obtaining a high signal-to-noise ratio with a relatively small number of comparators using a signal interpolator and a sigma-delta modulator.

The present invention is a result of a cooperation research between university and industry (research project no. 0414-20110009 titled "Research for Sigma-Delta Analog-to-Digital Converter).

2. Description of the Related Art

A quantizer is a device employed in an ADC (analog-to-digital converter) for converting an analog signal to a digital signal. Generally, a quantizer outputting an [n] bit PCM signal from an analog signal requires $[2^n-1]$ comparators. For instance, a quantizer outputting a four bit PCM signal from an analog signal requires fifteen comparators.

A quantizer having a small number of comparators has a poor SN (signal-to-noise) ratio due to large quantization error. Thus, in order to improve the SN ratio, the number of the comparators must be increased to enhance the resolution thereof. However, as the number of comparator increases, the power consumption of the quantizer also increases and an implementation of the quantizer becomes more difficult. Therefore, a quantizer capable of providing a high resolution and a superior SN ratio with a relatively small number of comparators is needed.

SUMMARY OF THE INVENTION

To solve the problem described above, it is an object of the present invention to provide a quantizer having a superior SN ratio with a relatively small number of comparators, an analog-to-digital converter including the same and a quantization method using the same.

According to one aspect of the present invention, there is provided a quantizer comprising: a signal interpolator configured to interpolate a first sample through an $N^{th}$ sample included in a sampled signal to generate an interpolated signal; a sigma-delta modulator configured to subject the interpolated signal to a sigma-delta modulation to generate a sigma-delta modulated signal; an averaging filter configured to average the sigma-delta modulated signal to generate an average signal; and a downsampler configured to downsample the average signal (where N is a natural number).

According to another aspect of the present invention, there is provided an analog-to-digital converter capable of converting an analog signal to a digital signal, comprising a quantizer including a signal interpolator configured to interpolate a first sample through an $N^{th}$ sample included in a sampled signal to generate an interpolated signal; a sigma-delta modulator configured to subject the interpolated signal to a sigma-delta modulation to generate a sigma-delta modulated signal; an averaging filter configured to average the sigma-delta modulated signal to generate an average signal; and a downsampler configured to downsample the average signal (where N is a natural number).

Preferably, the signal interpolator comprises an M-times sample repeater configured to generate (M×N) samples by repeating each of the first sample through the $N^{th}$ sample M times (where M is a natural number).

Preferably, the downsampler comprises an M-times downsampler configured to downsample the average signal.

Preferably, the sigma-delta modulator comprises a comparator unit and a sigma-delta loop connected between an input terminal and an output terminal of the comparator unit.

Preferably, the sigma-delta modulator is configured to compare an amplitude of each of the (M×N) samples with a threshold value of the comparator unit to output a first pulse signal through an $N^{th}$ pulse signal corresponding to differences between the threshold value and the amplitude of each of the (M×N) samples as the sigma-delta modulated signal.

Preferably, the averaging filter generates the average signal obtained by averaging the first pulse signal through the $N^{th}$ pulse signal.

The quantizer may further comprises: an integrator configured to integrate an output signal of the downsampler; and a subtractor configured to input a difference between an output signal of the integrator and the sampled signal to the signal intepolator.

According to yet another aspect of the present invention, there is provided a quantization method comprising: (a) interpolating a first sample through an $N^{th}$ sample included in a sampled signal to generate an interpolated signal; (b) subjecting the interpolated signal to a sigma-delta modulation to generate the sigma-delta modulated signal; (c) averaging the sigma-delta modulated signal to generate an average signal; and (d) downsampling the average signal generated in the step (c) (where N is a natural number).

Preferably, the step (a) comprises repeating each of the first sample through the $N^{th}$ sample M times to generate (M×N) samples (where M is a natural number).

Preferably, the step (d) comprises downsampling the average signal by Mtimes.

Preferably, the step (b) comprises comparing an amplitude of each of the (M×N) samples with a threshold value to output a first pulse signal through an $N^{th}$ pulse signal corresponding to differences between the threshold value and the amplitude of each of the (M×N) samples.

Preferably, the step (c) comprises generating the average signal obtained by averaging the first pulse signal through the $N^{th}$ pulse signal.

The method may further comprise: (e) integrating a signal obtained by downsampling the average signal in the step (d); and (f) interpolating a difference between the signal in the step (e) and the sampled signal.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 2A through FIG. 2E are diagrams illustrating signals processed in a quantizer in accordance with a first embodiment of the present invention.

FIG. 3A through FIG. 3E are diagrams illustrating signals processed in a quantizer in accordance with a second embodiment of the present invention.

DETAILED DESCRIPTION OF THE PREFERRED EMBODIMENTS

Hereinafter, a preferred embodiment of the present invention will be described in detail with reference to the accompanying drawings.

Figure 1:
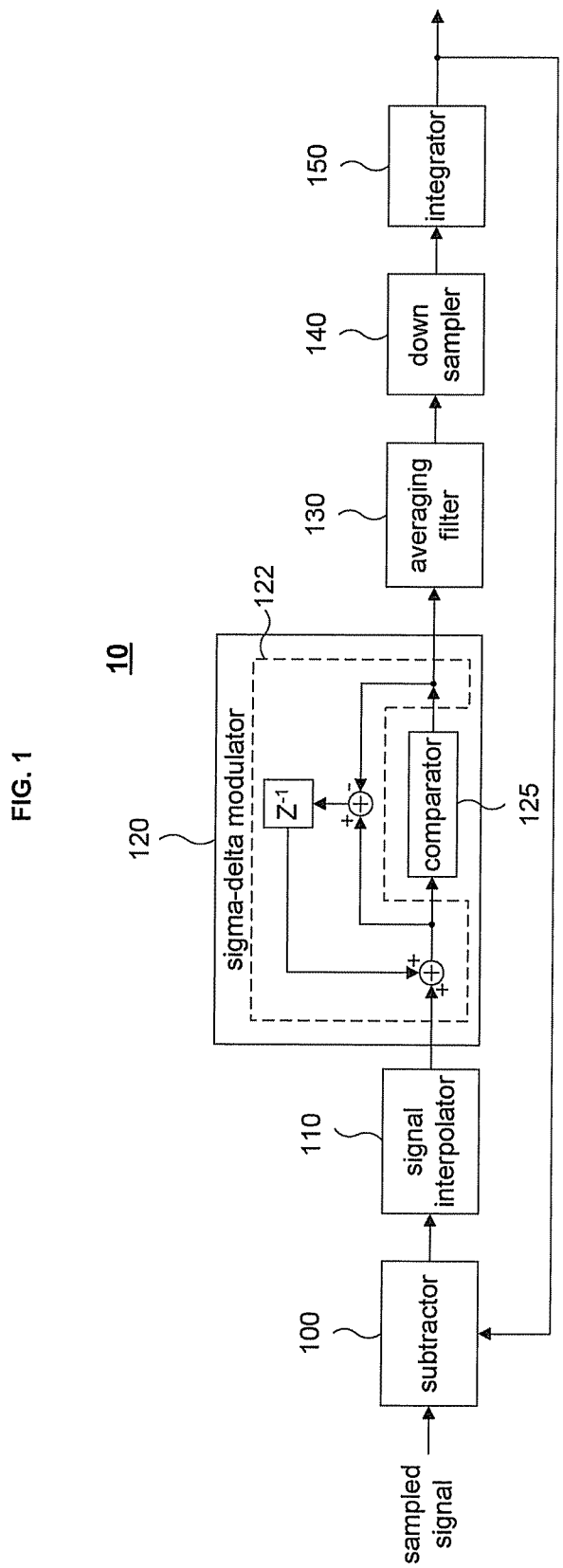
FIG. 1 is a block diagram illustrating a quantizer in accordance with a preferred embodiment of the present invention.

FIG. 1 is a block diagram illustrating a quantizer in accordance with a preferred embodiment of the present invention.

Referring to FIG. 1, a quantizer 10 in accordance with the present invention comprises a signal interpolator 110, a sigma-delta modulator 120, an averaging filter 130 and a downsampler 140. The quantizer 10 may further comprise a subtractor 100 and an integrator 150.

The signal interpolator 110 interpolates a first sample through an $N^{th}$ sample included in a sampled signal obtained by sampling an analog signal to generate an interpolated signal (where N is a natural number).

For instance, the signal interpolator 110 may comprise an M-times sample repeater capable of generating M×first samples through M×$N^{th}$ samples, i.e. (M×N) samples by repeating each of the first sample through the $N^{th}$ sample included in the sampled signal M times (where M is a natural number). In addition, the signal interpolator 110 may comprise an M-times upsampler capable of upsampling the first sample through the $N^{th}$ sample included in the sampled signal to generate (M×N) samples. Hereinafter, "interpolation" refers to generating (M×N) samples from N samples by a predetermined signal processing such as repeating each of the first sample through the $N^{th}$ sample M times and upsampling the first sample through the $N^{th}$ sample by M times.

The sigma-delta modulator 120 configured to subject the interpolated signal from the signal interpolator 110 to a sigma-delta modulation to generate a sigma-delta modulated signal. As shown in FIG. 1, the sigma-delta modulator 120 may comprise a comparator unit 125 and a sigma-delta loop 122. The comparator unit 125 is a device capable of outputting logic H (high) or logic L (low) according to an input signal. The comparator unit 125 may comprise one or more comparators. The sigma-delta loop 122 is connected between an input terminal and an output terminal of the comparator unit 125. The sigma-delta modulator 120 modulates the interpolated signal and outputs pulse signals as the sigma-delta modulated signal. For instance, when the signal interpolator 110 generates M×first samples through M×$N^{th}$ samples, i.e. a total of (M×N) samples by repeating each of the first sample through the $N^{th}$ sample included in the sampled signal M times, the sigma-delta modulator 120 generates a first pulse signal corresponding to M×first samples through $N^{th}$ pulse signal corresponding to M×$N^{th}$ samples.

The averaging filter 130 averages the sigma-delta modulated signal outputted from the sigma-delta modulator 120 and generates an average signal corresponding to an average of the sigma-delta modulated signal. For instance, the averaging filter 130 generates an average signal obtained by averaging each of the first pulse signal through the $N^{th}$ pulse signal.

The downsampler 140 downsamples the average signal outputted by the averaging filter 130. When the signal interpolator 110 includes an M-times sample repeater or an M-times upsampler, the downsampler 140 may include an M-times downsampler capable of downsampling the average signal by M times.

The integrator 150 integrates an output signal of the downsampler 140 and transmits the integrated signal to the subtractor 100.

The subtractor 100 inputs a difference between the output signal of the integrator 150 and the sampled signal to the signal interpolator 110.

The subtractor 100 and the integrator 150 prevent the quantizer 10 of the present invention from being unstable when amplitudes of the samples in the sampled signal are excessively large. Specifically, the subtractor 100 is configured to maintain the amplitude of the signal inputted to the signal interpolator 110 by inputting the difference between the output signal of the integrator 150 and the sampled signal to the signal interpolator 110. The integrator 150 is configured to compensate the output signal of the subtractor 100 which is obtained by calculating the difference between the output signal of the integrator 150 and the sampled signal.

Signal processing of a quantizer in accordance with a first embodiment of the present invention will be described in detail with reference to FIG. 2A through FIG. 2E.

FIG. 2A through FIG. 2E are diagrams illustrating signals processed in the quantizer in accordance with the first embodiment of the present invention, where the signal interpolator 110 of FIG. 1 is an M-times sample repeater repeating the sampled signal M times, and the comparator unit 125 of FIG. 1 comprises one comparator.

FIG. 2A shows four random consecutive samples of the first sample through the $N^{th}$ sample, i.e. a $k^{th}$ sample, a $(k+1)^{th}$ sample, a $(k+2)^{th}$ sample and a $(k+3)^{th}$ sample (where k is a natural number). The $k^{th}$ sample through the $(k+3)^{th}$ sample are obtained by sampling an analog signal at time $t_k$, time $t_{k+1}$, time $t_{k+2}$, time $t_{k+3}$, respectively.

Figure 2B:
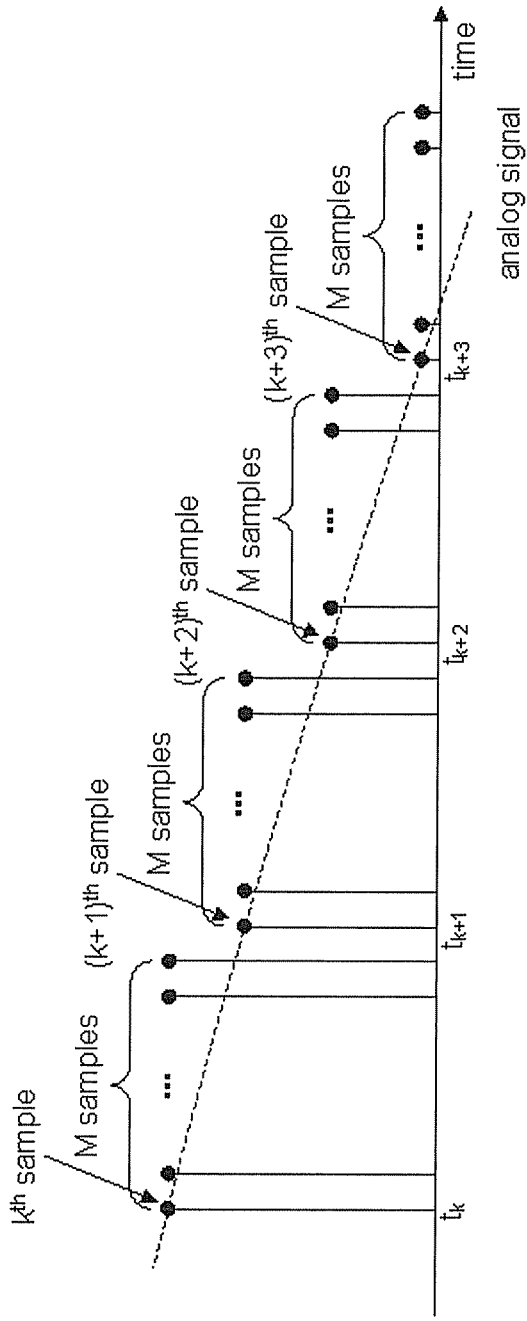

When the $k^{th}$ sample through the $(k+3)^{th}$ sample are inputted to the signal interpolator 110 shown in FIG. 1, the signal interpolator 110 repeats each of the $k^{th}$ sample through the $(k+3)^{th}$ sample M times to generate M×$k^{th}$ sample, M×$(k+1)^{th}$ sample, M×$(k+2)^{th}$ sample and M×$(k+3)^{th}$ sample as shown in FIG. 2b.

Figure 2C:
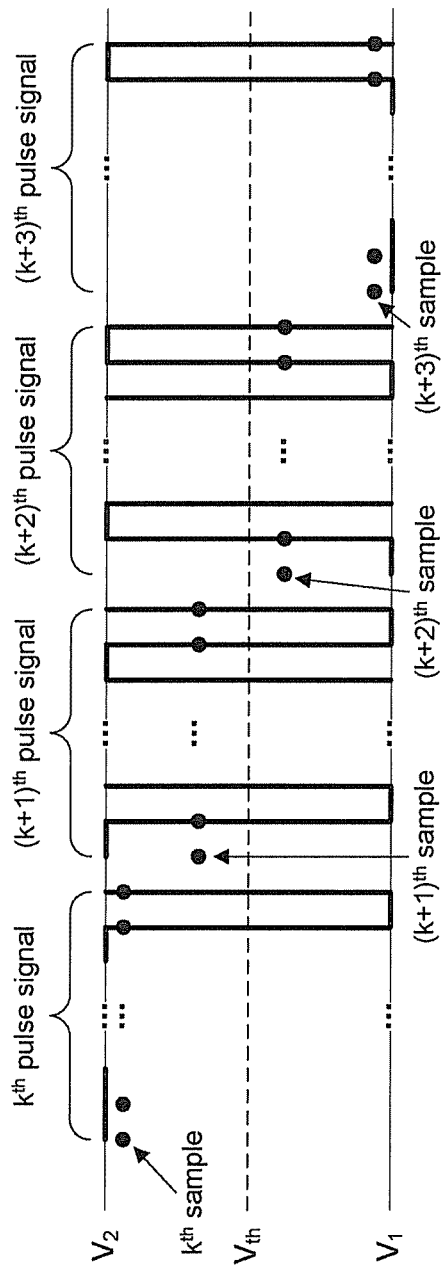

When M×$k^{th}$ sample through M×$(k+3)^{th}$ sample are inputted to the sigma-delta modulator 120 shown in FIG. 1, the sigma-delta modulator 120 modulates M×$k^{th}$ sample, M×$(k+1)$ in sample, M×$(k+2)^{th}$ sample and M×$(k+3)^{th}$ sample by sigma-delta modulation to generate a $k^{th}$ pulse signal, a $(k+1)^{th}$ pulse signal, a $(k+2)^{th}$ pulse signal and a $(k+3)^{th}$ pulse signal, respectively, swinging between $V_1$ and $V_2$ as shown in FIG. 2c.

When the $k^{th}$ sample is inputted to the sigma-delta modulator 120, the sigma-delta modulator 120 subjects the $k^{th}$ sample to the sigma-delta modulation to generate the $k^{th}$ pulse signal shown in FIG. 2c. The $k^{th}$ pulse signal has an amplitude of $V_2$ for a predetermined time period corresponding to the amplitude of the $k^{th}$ sample and swings between $V_1$ and $V_2$ and then terminates at $V_2$.

When the $(k+1)^{th}$ sample is inputted to the sigma-delta modulator 120, the sigma-delta modulator 120 subjects the $(k+1)^{th}$ sample to the sigma-delta modulation to generate the $(k+1)^{th}$ pulse signal shown in FIG. 2c. The $(k+1)^{th}$ pulse signal swings between $V_1$ and $V_2$ so as to correspond to the amplitude of the $(k+1)^{th}$ sample. When compared with the $k^{th}$ pulse signal, since the amplitude of the $k^{th}$ sample is larger than that of the $(k+1)^{th}$ sample, the time period during which the $k^{th}$ pulse signal is maintained at the amplitude of $V_2$ is greater than the time period during which the $(k+1)^{th}$ pulse signal is maintained at the amplitude of $V_2$. Further, since the amplitudes of the $k^{th}$ sample and the $(k+1)^{th}$ sample are greater than a threshold $V_{th}$, the $k^{th}$ pulse signal and the $(k+1)^{th}$ pulse signal start at $V_2$, swing between $V_1$ and $V_2$ and terminates at $V_2$.

When the $(k+2)^{th}$ sample is inputted to the sigma-delta modulator 120, the sigma-delta modulator 120 subjects the $(k+2)^{th}$ sample to the sigma-delta modulation to generate the $(k+2)^{th}$ pulse signal shown in FIG. 2c. The $(k+2)^{th}$ pulse signal swings between $V_1$ and $V_2$ so as to correspond to the amplitude of the $(k+2)^{th}$ sample. When compared with the $(k+1)^{th}$ pulse signal, since the amplitude of the $(k+1)^{th}$ sample is greater than the threshold $V_{th}$ and the $(k+2)^{th}$ sample is smaller than the threshold $V_{th}$, the $(k+2)^{th}$ pulse signal starts at $V_1$, swing between $V_1$ and $V_2$ and terminates at $V_1$ while the $(k+1)^{th}$ pulse signal starts at $V_2$, swing between $V_1$ and $V_2$ and terminates at $V_2$.

When the $(k+3)^{th}$ sample is inputted to the sigma-delta modulator 120, the sigma-delta modulator 120 subjects the $(k+3)^{th}$ sample to the sigma-delta modulation to generate the $(k+3)^{th}$ pulse signal shown in FIG. 2c. The $(k+3)^{th}$ pulse signal swings between $V_1$ and $V_2$ so as to correspond to the amplitude of the $(k+3)^{th}$ sample. When compared with the $(k+2)^{th}$ pulse signal, since the amplitude of the $(k+2)^{th}$ sample is larger than that of the $(k+3)^{th}$ sample, the time period during which the $(k+2)^{th}$ pulse signal is maintained at the amplitude of $V_2$ is greater than the time period during which the $(k+3)^{th}$ pulse signal is maintained at the amplitude of $V_2$. Further, since the amplitudes of the $(k+2)^{th}$ sample and the $(k+3)^{th}$ sample are smaller than the threshold $V_{th}$, the $(k+2)^{th}$ pulse signal and the $(k+3)^{th}$ pulse signal start at $V_1$, swing between $V_1$ and $V_2$ and terminates at $V_1$.

Above-described modulation may be performed by a typical first order sigma-delta modulator. However, the sigma-delta modulator 120 of the present invention is not limited to the first order sigma-delta modulator. Any sigma-delta modulator capable of modulating M-times repeated samples into a pulse signal corresponding to the amplitudes thereof can be employed as the sigma-delta modulator 120 of the present invention.

Figure 2D:
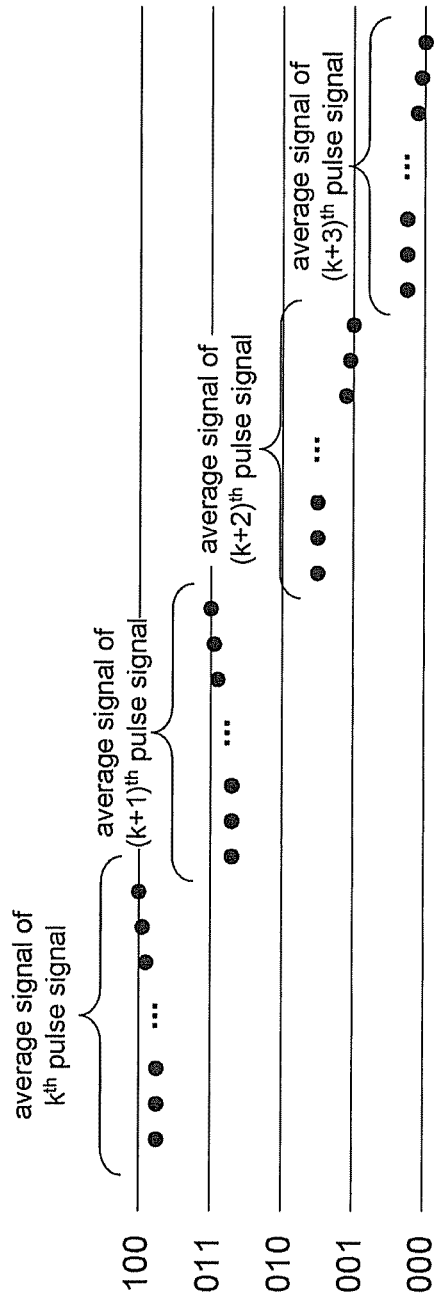

When the $k^{th}$ pulse signal through the $(k+3)^{th}$ pulse signal are inputted to the averaging filter 130 shown in FIG. 1, the averaging filter 130 generates and outputs an average signal of each of the $k^{th}$ pulse signal through the $(k+3)^{th}$ pulse signal as shown in FIG. 2D. The average signal of each of the $k^{th}$ pulse signal through the $(k+3)^{th}$ pulse signal are determined by the $k^{th}$ pulse signal through the $(k+3)^{th}$ pulse signal, respectively. Specifically, since the $k^{th}$ pulse signal and the $(k+3)^{th}$ pulse signal have the longest and the shortest time periods during which the amplitude is maintained at $V_2$, respectively, the $k^{th}$ pulse signal and the $(k+1)^{th}$ pulse signal start at $V_2$ and terminate at $V_2$, and the $(k+2)^{th}$ pulse signal and the $(k+3)^{th}$ pulse signal start at $V_1$ and terminate at $V_1$, the $k^{th}$ pulse signal and the $(k+3)^{th}$ pulse signal have the largest and the smallest averages, respectively as shown in FIG. 2D.

The average of each of the $k^{th}$ pulse signal through the $(k+3)^{th}$ pulse signal may have an arbitrary value corresponding the amplitude of the samples. That is, the average of each of the $k^{th}$ pulse signal through the $(k+3)^{th}$ pulse signal is of a value where an analog value of the sample is reflected. As shown in FIG. 2D, when the average of each of the $k^{th}$ pulse signal through the $(k+3)^{th}$ pulse signal is processed (e.g., by rounding or properly selecting the coefficients of the filter), the average of each of the $k^{th}$ pulse signal through the $(k+3)^{th}$ pulse signal corresponds to a binary value obtained by quantizing the samples. When a single comparator is used, only 1 bit value (two levels) can be obtained by a conventional quantizer. However, in accordance with the present invention, the average of the pulse signal has at least three levels even when only one comparator is used because the average of each of the $k^{th}$ pulse signal through the $(k+3)^{th}$ pulse signal has a value having an analog value of the sample reflected thereto. That is, as shown in FIG. 2D, a quantizer of at least 2 bit can be implemented with a single comparator.

FIG. 2E illustrates an output signal of the downsampler 140. Referring to FIG. 2E, the downsampler 140 downsamples the average signal which is the output signal of the averaging filter 130 by M times to generate an output signal shown in FIG. 2E. The output signal shown in FIG. 2E is obtained by downsampling the average signal, for example, by selecting an $M^{th}$ value of (M) averages values of each of the $k^{th}$ pulse signal through the $(k+3)^{th}$ pulse signal. However, the downsampling is not limited to selecting $M^{th}$ value, and any value can be selected from (M) averages values by the downsampling.

While FIG. 2A through FIG. 2E illustrates arbitrary four samples, the modulation shown FIG. 2A through FIG. 2E can be applied to a case where the first sample through the $N^{th}$ sample are inputted.

Signal processing of a quantizer in accordance with a second embodiment of the present invention will be described in detail with reference to FIG. 3A through FIG. 3E.

FIG. 3A through FIG. 3E are diagrams illustrating signals processed in the quantizer in accordance with the second embodiment of the present invention, where the signal interpolator 110 of FIG. 1 is an M-times sample repeater repeating the sampled signal M times, and the comparator unit 125 of FIG. 1 comprises three comparators.

FIG. 3A shows four random consecutive samples of the first sample through the $N^{th}$ sample, i.e. a $k^{th}$ sample, a $(k+1)^{th}$ sample, a $(k+2)^{th}$ and a $(k+3)^{th}$ sample (where k is a natural number). The $k^{th}$ sample through the $(k+3)^{th}$ sample are obtained by sampling an analog signal at time $t_k$, time $t_{k+1}$, time $t_{k+2}$, time $t_{k+3}$, respectively.

Figure 3B:
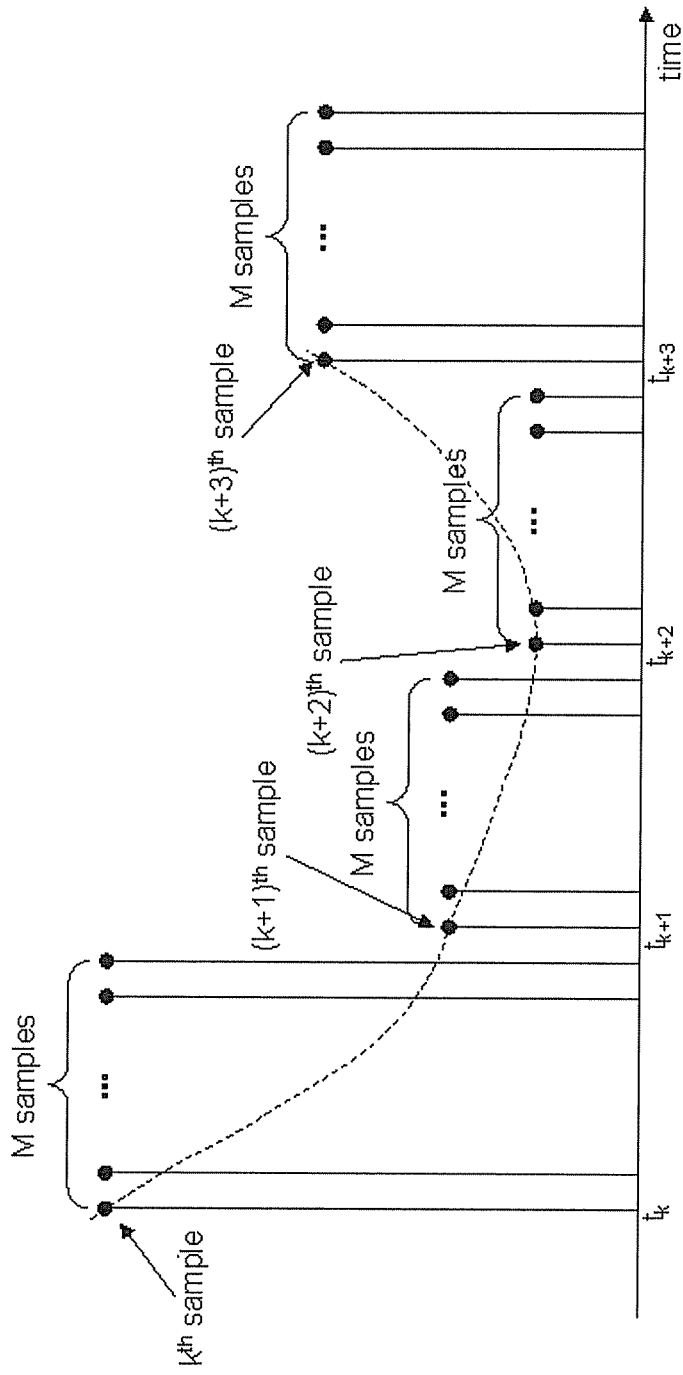

When the $k^{th}$ sample through the $(k+3)^{th}$ sample are inputted to the signal interpolator 110 shown in FIG. 1, the signal interpolator 110 repeats each of the $k^{th}$ sample through the $(k+3)^{th}$ sample M times to generate M×$k^{th}$ sample, M×$(k+1)^{th}$ sample, M×$(k+2)^{th}$ sample and M×$(k+3)^{th}$ sample as shown in FIG. 3B.

When M×$k^{th}$ sample through M×$(k+3)^{th}$ sample are inputted to the sigma-delta modulator 120 shown in FIG. 1, the sigma-delta modulator 120 modulates M×$k^{th}$ sample, M×$(k+1)^{th}$ sample, M×$(k+2)^{th}$ sample and M×$(k+3)^{th}$ sample by sigma-delta modulation to generate a $k^{th}$ pulse signal, a $(k+1)^{th}$ pulse signal, a $(k+2)^{th}$ pulse signal and a $(k+3)^{th}$ pulse signal, respectively, swinging between $V_1$ and $V_2$ or $V_2$ and $V_3$ as shown in FIG. 3C.

When the $k^{th}$ sample is inputted to the sigma-delta modulator 120, the sigma-delta modulator 120 subjects the $k^{th}$ sample to the sigma-delta modulation to generate the $k^{th}$ pulse signal shown in FIG. 3C. The $k^{th}$ pulse signal has an amplitude of $V_3$ for a predetermined time period corresponding to the amplitude of the $k^{th}$ sample and swings between $V_2$ and $V_3$ and then terminates at $V_3$. Specifically, since the amplitude of the $k^{th}$ sample is larger than the threshold $V_{th2}$, the $k^{th}$ pulse signal starts at $V_3$, swings between $V_2$ and $V_3$ and then terminates at $V_3$.

When the $(k+1)^{th}$ sample is inputted to the sigma-delta modulator 120, the sigma-delta modulator 120 subjects the $(k+1)^{th}$ sample to the sigma-delta modulation to generate the $(k+1)^{th}$ pulse signal shown in FIG. 3C. The $(k+1)^{th}$ pulse signal swings between $V_1$ and $V_2$ so as to correspond to the amplitude of the $(k+1)^{th}$ sample. Specifically, since the amplitude of the $(k+1)^{th}$ sample is larger than the threshold $V_{th1}$ and smaller than $V_2$, the $(k+1)^{th}$ pulse signal starts at $V_2$, swings between $V_1$ and $V_2$ and then terminates at $V_2$.

When the $(k+2)^{th}$ sample is inputted to the sigma-delta modulator 120, the sigma-delta modulator 120 subjects the $(k+2)^{th}$ sample to the sigma-delta modulation to generate the $(k+2)^{th}$ pulse signal shown in FIG. 3C. The $(k+2)^{th}$ pulse signal swings between $V_1$ and $V_2$ so as to correspond to the amplitude of the $(k+2)^{th}$ sample. Specifically, since the amplitude of the $(k+2)^{th}$ sample is smaller than the threshold $V_{th1}$, the $(k+2)^{th}$ pulse signal starts at $V_1$, swings between $V_1$ and $V_2$ and then terminates at $V_1$.

When compared with the $(k+1)^{th}$ pulse signal, since the amplitude of the $(k+1)^{th}$ sample is larger than the threshold $V_{th1}$ and the amplitude of the $(k+2)^{th}$ sample is smaller than the threshold $V_{th1}$, the $(k+2)^{th}$ pulse signal start at $V_1$, swing between $V_1$ and $V_2$ and terminates at $V_1$ while the $(k+1)^{th}$ pulse signal start at $V_2$, swing between $V_1$ and $V_2$ and terminates at $V_2$.

When the $(k+3)$ sample is inputted to the sigma-delta modulator 120, the sigma-delta modulator 120 subjects the $(k+3)^{th}$ sample to the sigma-delta modulation to generate the $(k+3)^{th}$ pulse signal shown in FIG. 3C. The $(k+3)^{th}$ pulse signal swings between $V_2$ and $V_3$ so as to correspond to the amplitude of the $(k+3)^{th}$ sample. Specifically, since the amplitude of the $(k+3)^{th}$ sample is smaller than the threshold $V_{th2}$ and larger than $V_2$, the $(k+3)^{th}$ pulse signal starts at $V_2$, swings between $V_2$ and $V_3$ and then terminates at $V_2$.

When compared with the $k^{th}$ pulse signal, since the amplitude of the $k^{th}$ sample is larger than that of the $(k+3)^{th}$ sample, the time period during which the $k^{th}$ pulse signal is maintained at the amplitude of $V_3$ is greater than the time period during which the $(k+3)^{th}$ pulse signal is maintained at the amplitude of $V_3$. Further, since the amplitudes of the $k^{th}$ sample is larger than the threshold $V_{th2}$ and the amplitude of the $(k+3)^{th}$ sample is smaller than the threshold $V_{th2}$, the $(k+3)^{th}$ pulse signal starts at $V_2$, swings between $V_2$ and $V_3$ and terminates at $V_2$ while the $k^{th}$ pulse signal starts at $V_3$, swings between $V_2$ and $V_3$ and terminates at $V_3$.

When compared with the $(k+2)^{th}$ pulse signal, the $(k+3)^{th}$ pulse signal swings between $V_2$ and $V_3$ because the amplitude of the $(k+3)^{th}$ sample is between $V_2$ and $V_3$ while the $(k+2)^{th}$ pulse signal swings between $V_1$ and $V_2$ because the amplitude of the $(k+2)^{th}$ sample is between $V_1$ and $V_2$.

That is, when the amplitude of the sample is between $V_1$ and $V_2$, the pulse signal swings between $V_1$ and $V_2$, and when the amplitude of the sample is between $V_2$ and $V_3$, the pulse signal swings between $V_2$ and $V_3$. In addition, when the amplitude of the sample is smaller than the threshold $V_{th1}$ or the threshold $V_{th2}$, the pulse signal starts at $V_1$ or $V_2$, and when the amplitude of the sample is larger than the threshold $V_{th1}$ or the threshold $V_{th2}$, the pulse signal starts at $V_2$ or $V_3$. In addition, the time period during which the amplitude of the pulse signal is maintained at $V_2$ or $V_3$ proportional to the amplitude of the sample.

Above-described modulation may be performed by a typical first order sigma-delta modulator. However, the sigma-delta modulator 120 of the present invention is not limited to the first order sigma-delta modulator. Any sigma-delta modulator capable of modulating M-times repeated samples into a pulse signal corresponding to the amplitudes thereof can be employed as the sigma-delta modulator 120 of the present invention.

Figure 3D:
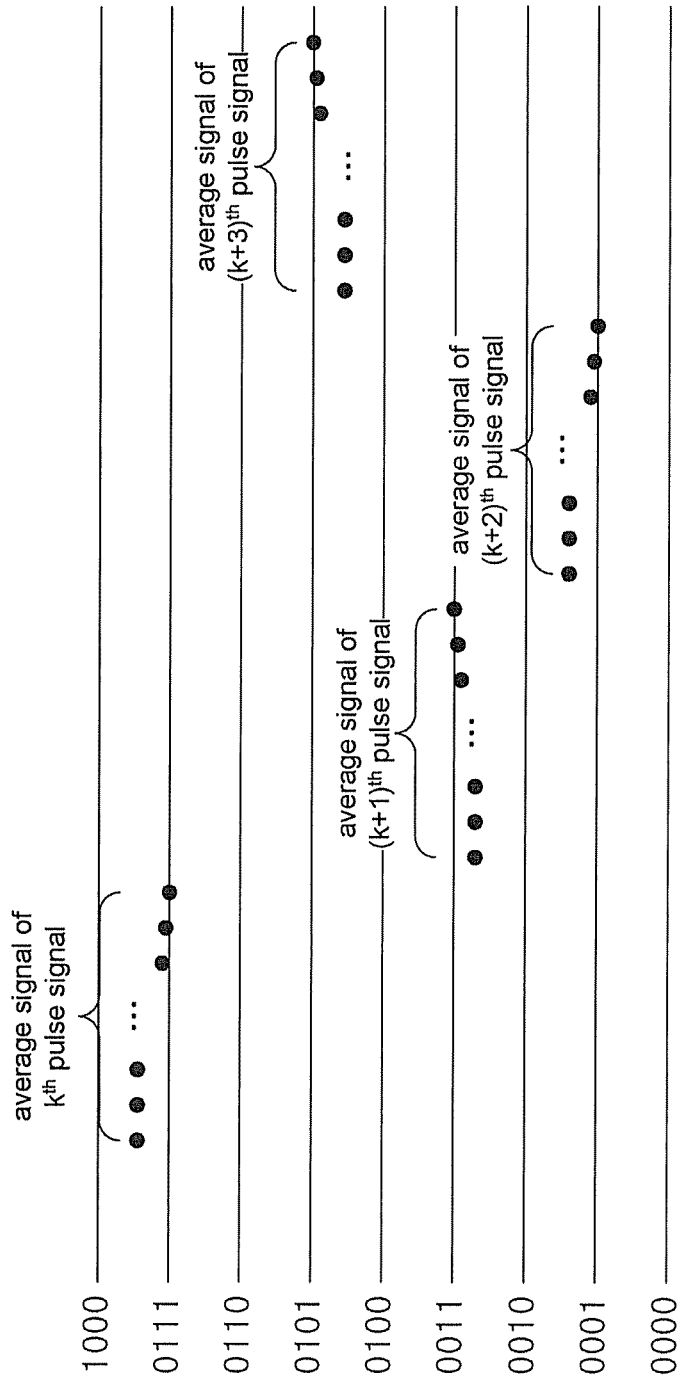

When the $k^{th}$ pulse signal through the $(k+3)^{th}$ pulse signal are inputted to the averaging filter 130 shown in FIG. 1, the averaging filter 130 generates and outputs an average signal of each of the $k^{th}$ pulse signal through the $(k+3)^{th}$ pulse signal as shown in FIG. 3D. The average signal of each of the $k^{th}$ pulse signal through the $(k+3)^{th}$ pulse signal are determined by the $k^{th}$ pulse signal through the $(k+3)^{th}$ pulse signal, respectively. Specifically, since the $k^{th}$ pulse signal and the $(k+3)^{th}$ pulse signal have the longest and the shortest time periods during which the amplitude is maintained at $V_3$, respectively, the $k^{th}$ pulse signal starts at $V_3$ and terminate at $V_3$, the $(k+1)^{th}$ pulse signal and the $(k+3)^{th}$ pulse signal start at $V_2$ and terminate at $V_2$, and the $(k+2)^{th}$ pulse signal starts at $V_1$ and terminate at $V_1$, the $k^{th}$ pulse signal and the $(k+2)^{th}$ pulse signal have the largest and the smallest averages, respectively as shown in FIG. 3D.

The average of each of the $k^{th}$ pulse signal through the $(k+3)^{th}$ pulse signal may have an arbitrary value corresponding the amplitude of the samples. That is, the average of each of the $k^{th}$ pulse signal through the $(k+3)^{th}$ pulse signal is of a value where an analog value of the sample is reflected. As shown in FIG. 3D, when the average of each of the $k^{th}$ pulse signal through the $(k+3)^{th}$ pulse signal is processed (e.g., by rounding or properly selecting the coefficients of the filter), the average of each of the $k^{th}$ pulse signal through the $(k+3)^{th}$ pulse signal corresponds to a binary value obtained by quantizing the samples. When two comparator are used, only 1.5 bit value (three levels) can be obtained by a conventional quantizer. However, in accordance with the present invention, the average of the pulse signal has at least eight levels even when only two comparators are used because the average of each of the $k^{th}$ pulse signal through the $(k+3)^{th}$ pulse signal has a value having an analog value of the sample reflected thereto. That is, as shown in FIG. 3D, a quantizer of at least 3 bit can be implemented with two comparators.

FIG. 3E illustrates an output signal of the downsampler 140. Referring to FIG. 3E, the downsampler 140 downsamples the average signal which is the output signal of the averaging filter 130 by M times to generate an output signal shown in FIG. 3E. The output signal shown in FIG. 3E is obtained by downsampling the average signal, for example, by selecting an $M^{th}$ value of (M) averages values of each of the $k^{th}$ pulse signal through the $(k+3)^{th}$ pulse signal. However, the downsampling is not limited to selecting $M^{th}$ value, and any value can be selected from (M) averages values by the downsampling.

While FIG. 3A through FIG. 3E illustrates arbitrary four samples, the modulation shown FIG. 3A through FIG. 3E can be applied to a case where the first sample through the $N^{th}$ sample are inputted.

Figure 4:
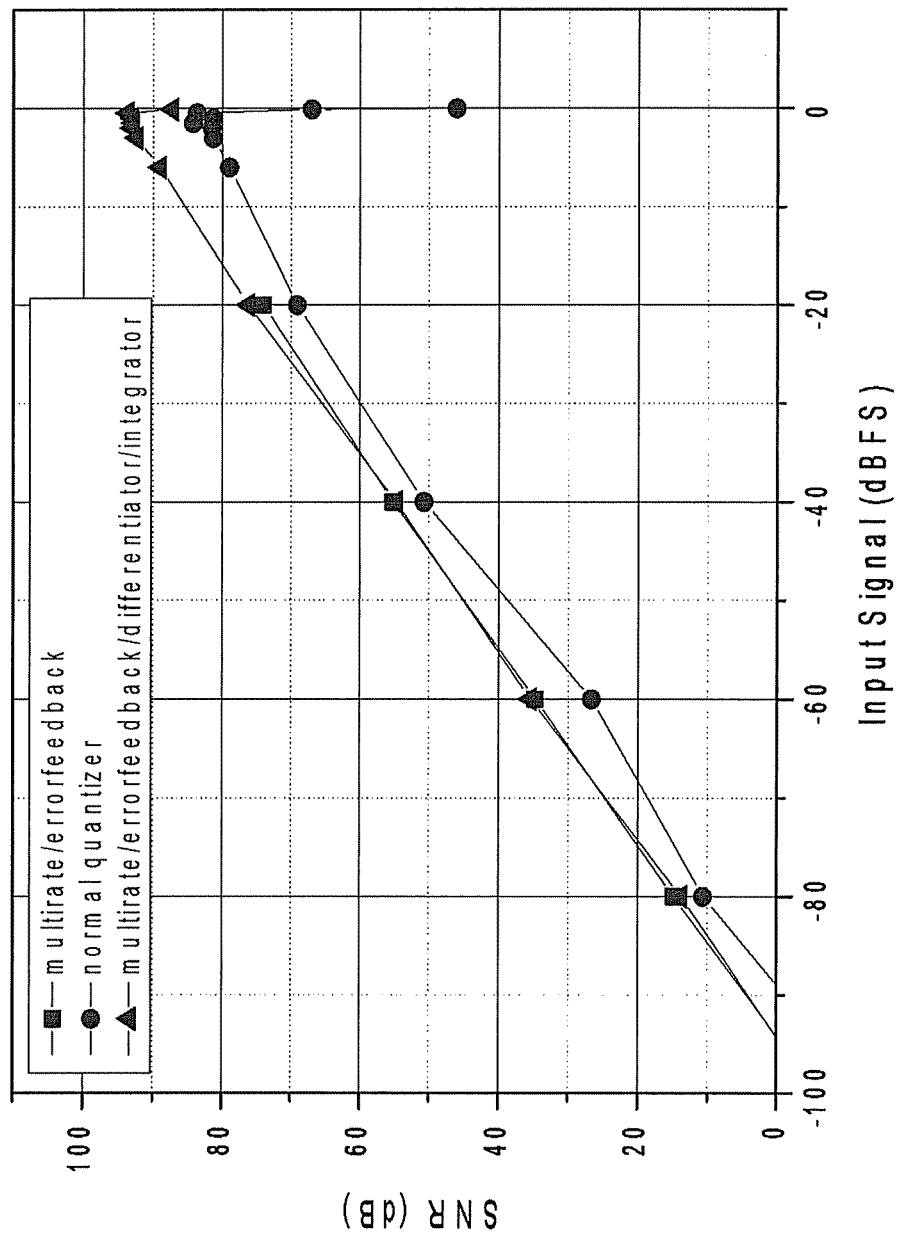
FIG. 4 is a graph illustrating signal-to-noise ratios of an analog-to-digital converter employing a quantizer in accordance with the present invention and a conventional analog-to-digital converter.

FIG. 4 is a graph illustrating signal-to-noise ratios of an analog-to-digital converter employing a quantizer in accordance with the present invention and a conventional analog-to-digital converter, wherein ● denotes the signal-to-noise ratio of a conventional analog-to-digital converter, ■ denotes a signal-to-noise ratio of an analog-to-digital converter employing a quantizer in accordance with the present invention without the subtractor and integrator, and ▲ denotes a signal-to-noise ratio of an analog-to-digital converter employing a quantizer in accordance with the present invention with the subtractor and integrator Referring to FIG. 4, the analog-to-digital converter employing the quantizer in accordance with the present invention has an improved signal-to-noise ratio compared to the conventional analog-to-digital converter even when the same number of comparators is employed. Moreover, the signal-to-noise ratio is reduced only slightly even when the input signal is large with a subtractor and an integrator.

An analog-to-digital converter in accordance with the present invention will be described in detail with reference to FIG. 5.

Figure 5:
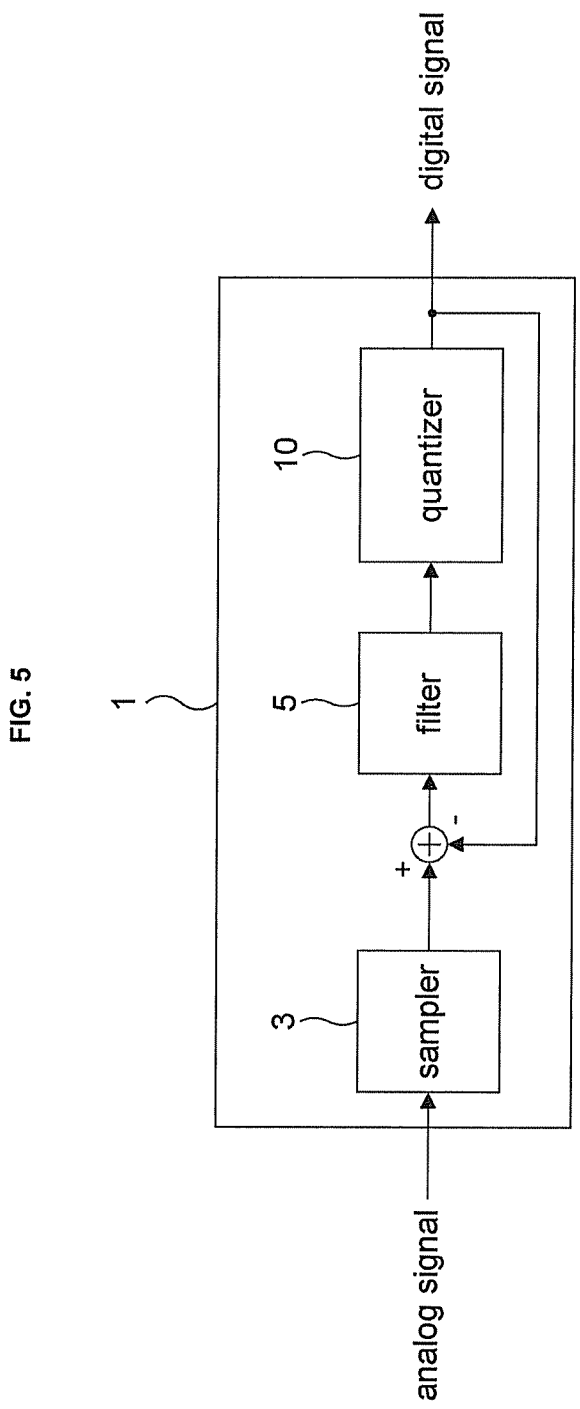
FIG. 5 is a block diagram illustrating an ADC (analog-to-digital converter) in accordance with the present invention.

FIG. 5 is a block diagram illustrating the ADC (analog-to-digital converter) in accordance with the present invention.

Referring to FIG. 5, the ADC 1 in accordance with the present invention comprises a sampler 3, a filter 5 and a quantizer 10.

The sampler 3 samples an analog signal to generate a sampled signal.

The filter 5 filters a signal corresponding to a difference between the sampled signal and a feedback signal. The filter 5 may comprise a low-pass filter or a band-pass filter.

The quantizer 10 quantizes an output signal of the filter 5. The quantizer 10 is identical to one shown in FIG. 1. Therefore, a detailed description thereof is omitted.

A quantization method in accordance with the present invention will be described in detail with reference to FIG. 6.

Figure 6:
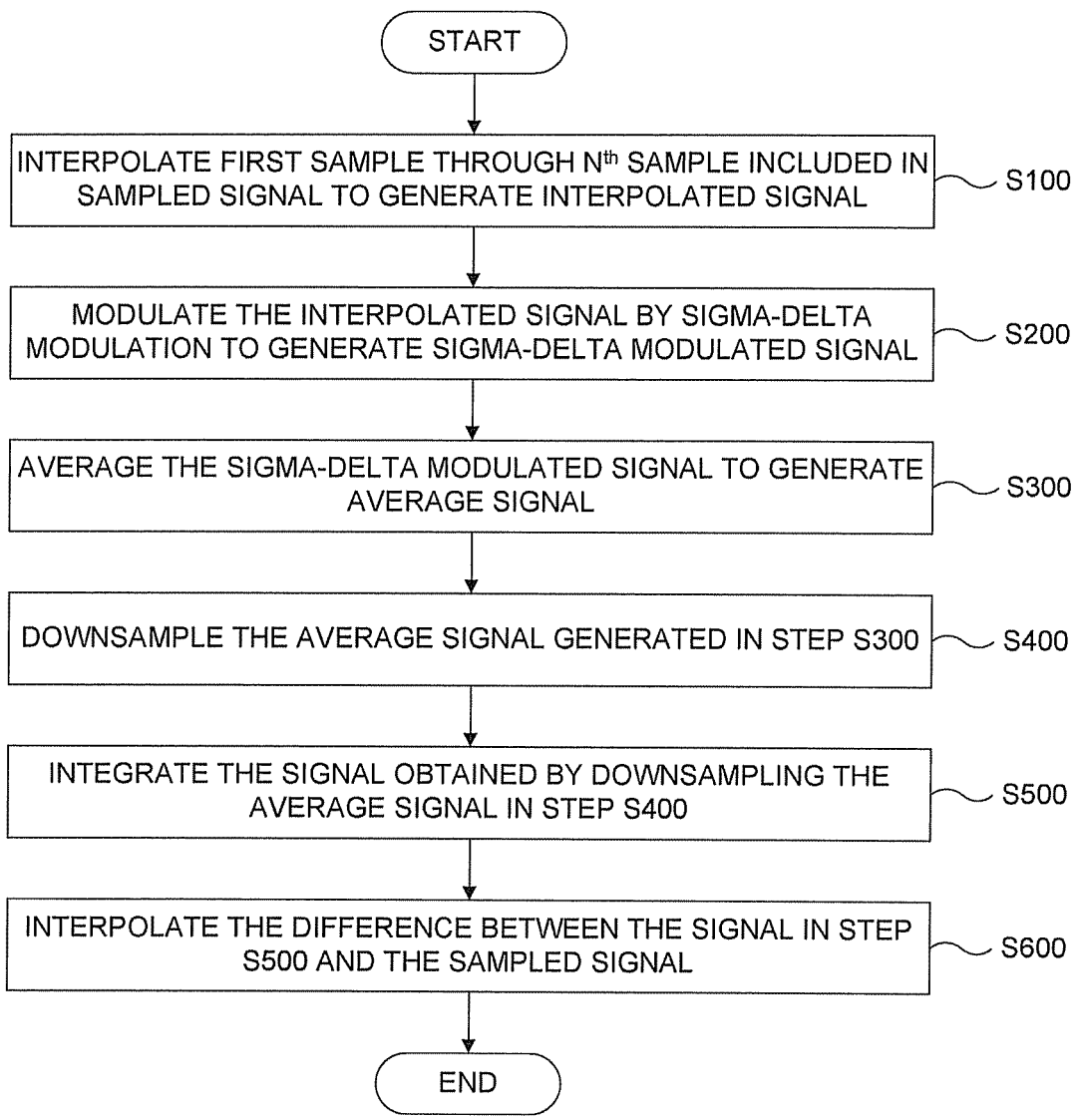
FIG. 6 is a flow diagram illustrating a quantization method in accordance with a preferred embodiment of the present invention.

FIG. 6 is a flow diagram illustrating a quantization method in accordance with the present invention.

Referring to FIG. 6, a first sample through an $N^{th}$ sample included in a sampled signal are interpolated to generate an interpolated signal (S100).

Thereafter, the interpolated signal is subjected to a sigma-delta modulation to generate a sigma-delta modulated signal (S200).

Thereafter, the sigma-delta modulated signal is averaged to generate an average signal (S300).

The average signal generated in the step S300 is downsampled (S400).

A signal obtained by the downsampling in the step S400 is integrated and the integrated signal is transmitted to a subtractor (S500).

Thereafter, the difference between the integrated signal from the integrator and the sampled signal is inputted to the signal interpolator (negative feedback) (S600).

A quantization method in accordance with a preferred embodiment of the present invention will be described in detail with reference to FIG. 7.

Figure 7:
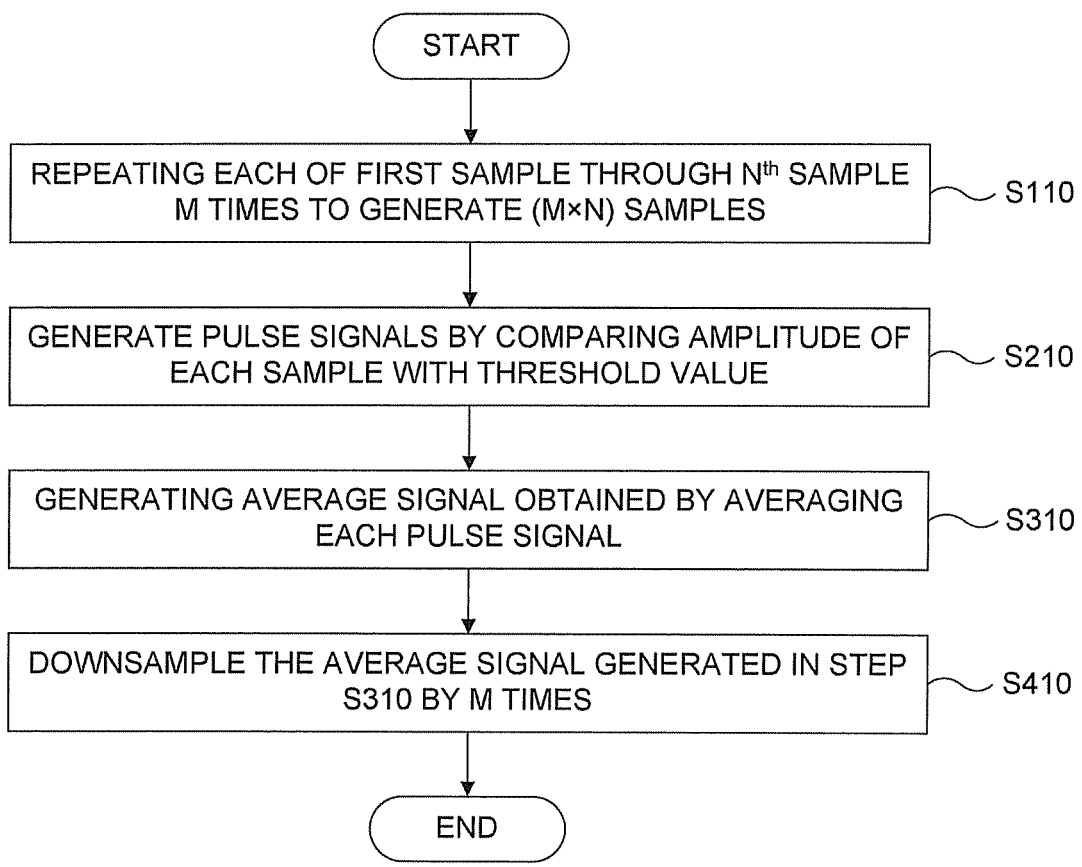
FIG. 7 is a flow diagram illustrating the quantization method in accordance with the preferred embodiment of the present invention shown in FIG. 6 in more detail.

FIG. 7 is a flow diagram illustrating the quantization method in accordance with the preferred embodiment of the present invention shown in FIG. 6 in more detail wherein the sampled signal is repeated M times.

Referring to FIG. 7, each of the first sample through the $N^{th}$ sample are repeated M times to generate M×first samples through M×$N^{th}$ samples, i.e. M×N samples (S110). The signal processing to generate the M×N samples by repeating each of the first sample through the $N^{th}$ sample is identical to that shown in FIG. 2B or FIG. 3B. Therefore, a detailed description is omitted.

Thereafter, amplitudes of M×first samples through M×$N^{th}$ samples are compared with the threshold value(s) of comparator(s) to generate a first pulse signal through an $N^{th}$ pulse signal corresponding to the first sample through the $N^{th}$ sample (S210).

The step S210 is performed by the sigma-delta modulator 120 shown in FIG. 1. An example where four arbitrary samples of the first sample through the $N^{th}$ sample, namely, the $k^{th}$ sample through the $(k+3)^{th}$ sample is modulated by the sigma-delta modulation to generate the $k^{th}$ pulse signal through the $(k+3)^{th}$ sample are described with reference to FIG. 2C and FIG. 3C above. Therefore, a detailed description thereof is omitted.

Thereafter, each of the first pulse signal through the $N^{th}$ pulse signal are averaged to generate an average signal (S310). The averaging process of each of the first pulse signal through the $N^{th}$ pulse signal is identical to that shown in FIG. 2D and FIG. 3D. Therefore, a detailed description is omitted.

Thereafter, the average signal obtained in the step S310 is downsampled by M times (S410). The downsampling process of the average signal is identical to that shown in FIG. 2E and FIG. 3E. Therefore, a detailed description is omitted.

The quantizer and the quantizing method in accordance with the present invention have following advantages:

(a) quantizer and analog-to-digital converter of the present invention are capable of providing a high resolution compared to conventional ones having the same number of comparators;

(b) quantizer and analog-to-digital converter of the present invention are capable of providing a superior SN ratio compared to conventional ones having the same number of comparators;

(c) an amplitude range of an input signal can be increased;

(d) quantization error is reduced and the quantization error can be made whiter;

(e) oversampling analog-to-digital converter with a low power consumption can be implemented; and (f) a noise shaping order of sigma-delta ADC can be increased by 1 when the quantizer of the present invention is employed in sigma-delta ADC.

What is claimed is:

1. A quantizer comprising:
a signal interpolator configured to interpolate a first sample through an $N^{th}$ sample included in a sampled signal to generate an interpolated signal;
a sigma-delta modulator configured to subject the interpolated signal to a sigma-delta modulation to generate a sigma-delta modulated signal;
an averaging filter configured to average the sigma-delta modulated signal to generate an average signal;
a downsampler configured to downsample the average signal;
an integrator configured to integrate an output signal of the downsampler; and
a subtractor configured to input a difference between an output signal of the integrator and the sampled signal to the signal interpolator (where N is a natural number).

2. The quantizer in accordance with claim 1, wherein the signal interpolator comprises an M-times sample repeater configured to generate (M×N) samples by repeating each of the first sample through the $N^{th}$ sample M times (where M is a natural number).

3. The quantizer in accordance with claim 2, wherein the downsampler comprises an M-times downsampler configured to downsample the average signal by M times.

4. The quantizer in accordance with claim 2, wherein the sigma-delta modulator comprises a comparator unit and a sigma-delta loop connected between an input terminal and an output terminal of the comparator unit.

5. The quantizer in accordance with claim 4, wherein the sigma-delta modulator is configured to compare an amplitude of each of the (M×N) samples with a threshold of the comparator unit to output a first pulse signal through an $N^{th}$ pulse signal corresponding to differences between the threshold and the amplitude of each of the (M×N) samples as the sigma-delta modulated signal.

6. The quantizer in accordance with claim 5, wherein the averaging filter generates the average signal obtained by averaging each of the first pulse signal through the $N^{th}$ pulse signal.

7. A quantization method comprising:
(a) interpolating a first sample through an $N^{th}$ sample included in a sampled signal to generate an interpolated signal;
(b) subjecting the interpolated signal to a sigma-delta modulation to generate a sigma-delta modulated signal;
(c) averaging the sigma-delta modulated signal to generate an average signal;
(d) downsampling the average signal generated in the step (c);
(e) integrating a signal obtained by downsampling the average signal in the step (d); and
(f) interpolating a difference between the signal in the step (e) and the sampled signal (where N is a natural number).

8. The method in accordance with claim 7, wherein the step (a) comprises repeating each of the first sample through the $N^{th}$ sample M times to generate (M×N) samples (where M is a natural number).

9. The method in accordance with claim 8, wherein the step (d) comprises downsampling the average signal by M times.

10. The method in accordance with claim 8, wherein the step (b) comprises comparing an amplitude of each of the (M×N) samples with a threshold value to output a first pulse signal through an $N^{th}$ pulse signal corresponding to differences between the threshold value and the amplitude of each of the (M×N) samples.

11. The method in accordance with claim 10, wherein the step (c) comprises generating the average signal obtained by averaging each of the first pulse signal through the $N^{th}$ pulse signal.

12. An analog-to-digital converter capable of converting an analog signal to a digital signal, comprising a quantizer including a signal interpolator configured to interpolate a first sample through an $N^{th}$ sample included in a sampled signal to generate an interpolated signal; a sigma-delta modulator configured to subject the interpolated signal to a sigma-delta modulation to generate a sigma-delta modulated signal; an averaging filter configured to average the sigma-delta modulated signal to generate an average signal; and a downsampler configured to downsample the average signal; an integrator configured to integrate an output signal of the downsampler; and a subtractor configured to input a difference between an output signal of the integrator and the sampled signal to the signal interpolator (where N is a natural number).

13. The analog-to-digital converter in accordance with claim 12, wherein the signal interpolator comprises an M-times sample repeater configured to generate (M×N) samples by repeating each of the first sample through the $N^{th}$ sample M times (where M is a natural number).

14. The analog-to-digital converter in accordance with claim 13, wherein the downsampler comprises an M-times downsampler configured to downsample the average signal.

15. The analog-to-digital converter in accordance with claim 13, wherein the sigma-delta modulator comprises a comparator unit and a sigma-delta loop connected between an input terminal and an output terminal of the comparator unit.

16. The analog-to-digital converter in accordance with claim 15, wherein the sigma-delta modulator is configured to compare an amplitude of each of the (M×N) samples with a threshold value of the comparator unit to output a first pulse signal through an $N^{th}$ pulse signal corresponding to differences between the threshold value and the amplitude of each of the (M×N) samples as the sigma-delta modulated signal.

17. The analog-to-digital converter in accordance with claim 16, wherein the averaging filter generates the average signal obtained by averaging the first pulse signal through the $N^{th}$ pulse signal.

* * * * *